United States Patent [19]
Villa et al.

[11] Patent Number: 6,040,734
[45] Date of Patent: Mar. 21, 2000

[54] SUPPLY VOLTAGES SWITCH CIRCUIT

[75] Inventors: Corrado Villa; Luigi Bettini, both of Milan; Simone Bartoli, Pisa, all of Italy

[73] Assignee: SGS-Thomson Microelectronics S.r.l., Agrate Brianza, Italy

[21] Appl. No.: 09/109,630

[22] Filed: Jul. 2, 1998

Related U.S. Application Data

[63] Continuation of application No. 08/775,109, Dec. 30, 1996, abandoned.

[30] Foreign Application Priority Data

Dec. 29, 1995 [EP] European Pat. Off. .............. 95830556
Jun. 20, 1996 [EP] European Pat. Off. .............. 96830353

[51] Int. Cl.$^7$ .................................................. H02J 3/38
[52] U.S. Cl. .......................... 327/530; 327/423; 327/424; 327/588
[58] Field of Search .................................. 327/530, 544, 327/545, 546, 407–410, 423, 424, 494–497, 588

[56] References Cited

U.S. PATENT DOCUMENTS

| | | | |
|---|---|---|---|
| 4,441,035 | 4/1984 | Demetriou | 327/546 |
| 5,008,566 | 4/1991 | Hashimoto | 327/543 |
| 5,210,475 | 5/1993 | Juzswik et al. | 318/293 |
| 5,296,757 | 3/1994 | Koizumi | 326/21 |
| 5,426,396 | 6/1995 | Bee | 330/253 |
| 5,457,414 | 10/1995 | Inglis et al. | 327/77 |

*Primary Examiner*—Kenneth B. Wells
*Assistant Examiner*—An T. Luu
*Attorney, Agent, or Firm*—Theodore E. Galanthay; David V. Carlson; Seed IP Law Group PLLC

[57] ABSTRACT

A circuit for switching between supply voltages and in particular for non-volatile flash memory devices and of the type comprising a first and a second circuit branch each incorporating a pair of transistors connected in series provides that at least one branch of the circuit be structured with a bridge circuit made up of P-channel MOS transistors. The bridge is made of a first and a second pairs of transistors connected between a first supply voltage reference and a common node. The first pair comprises transistors bigger than the transistors of the second pair while between the transistors making up the second pair is inserted a pair of resistors. Between the pair of resistors there is an interconnection node connected to a corresponding interconnection node between the transistors of the first pair.

10 Claims, 2 Drawing Sheets

SUPPLY VOLTAGES SWITCH CIRCUIT

CROSS REFERENCE TO RELATED APPLICATIONS

This application is a continuation of U.S. patent application Ser. No. 08/775,109, filed Dec. 30, 1996, now abandoned.

TECHNICAL FIELD

The present invention relates to a circuit for switching between supply voltages in an electrically programmable non-volatile memory device.

BACKGROUND OF THE INVENTION

As known, in electrically programmable non-volatile memory devices integrated on semiconductor and in particular of the flash type there is a need to power a circuitry section with different voltages depending on the type of operation to be performed.

For example, during the reading and decoding phase of a row of the memory matrix the row decoding block is powered with a standard supply voltage Vcc of approximately 5V.

But during the programming phase the same block is powered with a programming voltage Vp higher than the supply voltage Vcc. The programming voltage can be generated in the memory circuit or supplied by an external power supply connected to a pin of the memory circuit.

A prior art solution for providing switching circuitry to switch between power supplies is illustrated in the annexed FIG. 1.

This solution calls for switching circuitry 20 comprising two circuit branches 22 and 23 each having two P-channel MOS transistors arranged in mutual series.

For the first branch 22 the transistors MA and MB are indicated while for the second branch 23 the transistors MC and MD are indicated.

It is known that biasing of the well regions of the P-channel transistors requires particular precautions since an erroneous well potential can generate dangerous latch-up phenomena.

The well region of the first transistor MA of the first branch is connected to a first voltage reference SUPPLY1 which can be made equal to the standard supply voltage Vcc while the well region of the first transistor MC of the second branch is connected to a second reference voltage SUPPLY2.

The well regions of the two remaining transistors MB and MD are connected to a common circuit node C on which is present the same voltage VSW.

For no junction to be biased directly it is sufficient that the interconnection nodes A and B between the first and second transistors of each branch, i.e. between MA and MB on one side and MC and MD on the other side, be supplied by the lower of the voltages SUPPLY1 and SUPPLY2.

In other words, it is basically important for correct operation of the circuit that the voltage on the interconnection nodes A, B remain higher than that on the common node C.

There is provided for this purpose the presence of the N-channel transistors M1, M2 for the first branch and M3, M4 for the second branch. These transistors impose on the corresponding interconnection node A or B the lower voltage between the two possible supply voltages SUPPLY1 and SUPPLY2.

Although advantageous in some ways, this solution is not without some shortcomings as set forth below.

The bias of the interconnection nodes A and B is effective only when the difference between the two supply voltages SUPPLY1 and SUPPLY2 is appreciable. But when the values of these two voltages are very close, e.g. if they differ only by the threshold of an N-channel transistor, the body effect causes a floating behavior of the interconnection node.

Essentially, a switching phase calling for the discharge of the common node C from a high voltage, e.g. 12V, to a lower supply voltage, e.g. Vcc, would cause direct biasing of the first transistor MA if the difference between the two supply voltages SUPPLY1 and SUPPLY2 were less than 2V.

In addition, since there is a need to reduce the overall voltage drop on the switching circuitry, in the switching circuitry there are normally used big transistors with capacitances on the order of hundreds of picofarads. The switch causes a violent discharge of the common node C but if the node C is to return to the higher potential the inertia of the transistors slows the circuit.

SUMMARY OF THE INVENTION

According to principles of the present invention, a circuit is provided having structural and functional characteristics for switching between power supplies and capable of overcoming the limitations and shortcomings of the current solutions proposed by the prior art.

In this specific field of application there is a need to power the row decoding block with voltages lower than the supply voltage Vcc for example to carry out testing operations.

The problem then arises of how to efficiently perform a switch between the standard power supply Vcc and a second power supply.

Specifically, the circuitry assigned to switching between the different voltages is preferred to meet the following requirements.

1. The voltage drop on the switching circuitry must be as small as possible. Accordingly, it is preferred to use P-channel MOS transistors because of their low threshold characteristics.

2. The switching circuitry must be capable of managing voltages either higher or lower than the standard voltage Vc.

3. The well regions of the transistors incorporated in the switching circuitry are preferred to be connected to the references with the higher supply voltage.

4. The switches must take place in a controlled manner since the memory device downstream of the switching circuitry displays high capacitance.

Among the points listed here the third point is particularly critical.

The solution underlying the present invention is to employ an unbalanced bridge circuit on each branch of the switching circuitry.

On the basis of this solution a circuit according to an embodiment of the invention is described of the type comprising at least a first and a second circuit branch each comprising a pair of series-connected transistors with the first branch connected to a first reference supply voltage and the second branch connected to a second reference supply voltage and with the first and second branches being connected together in a common node.

The characteristics and advantages of the circuit in accordance with the present invention are set forth in the disclosure of an embodiment thereof given below by way of non-limiting example with reference to the annexed drawings.

DETAILED DESCRIPTION OF THE INVENTION

Figure 2:
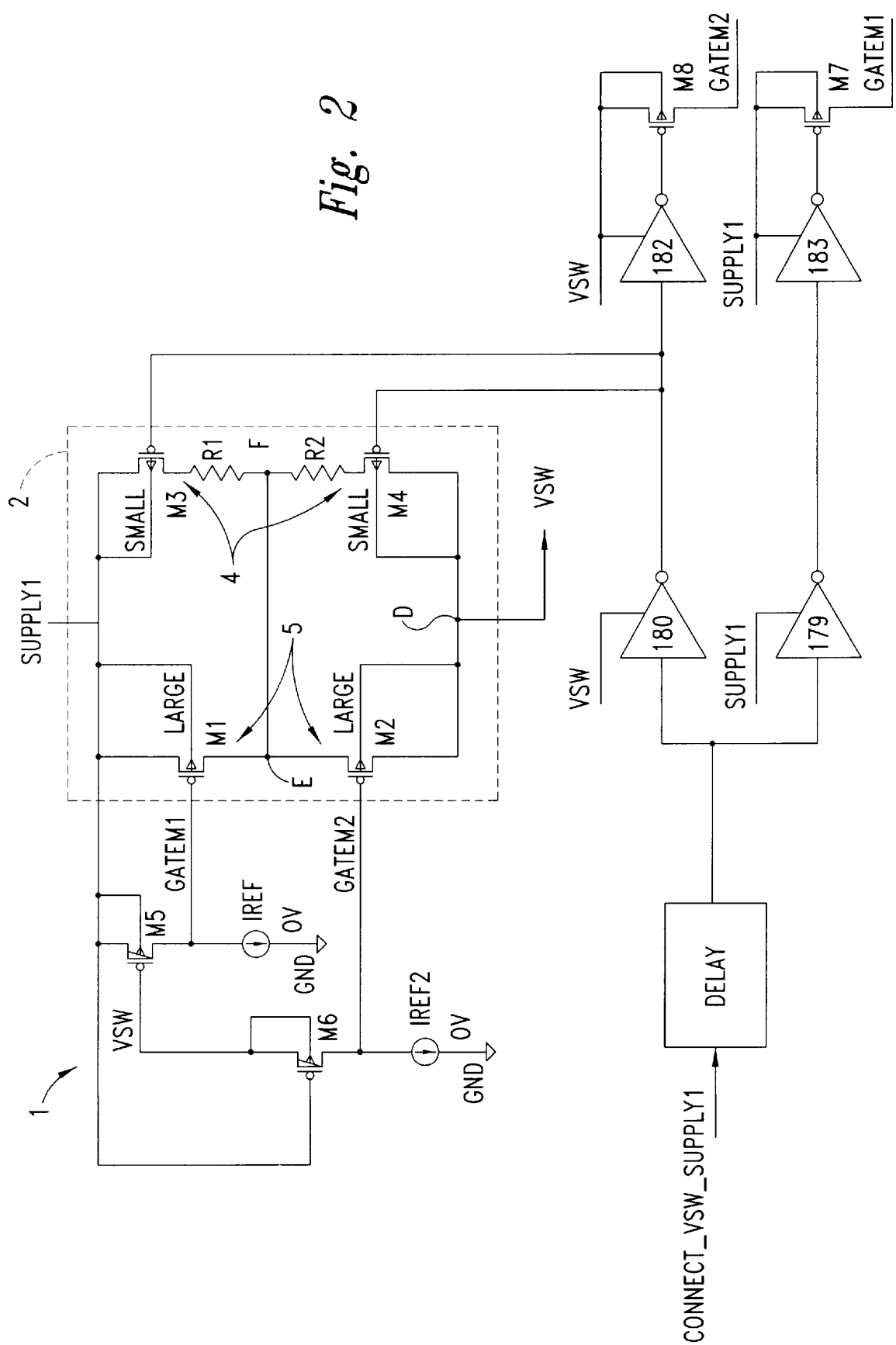
FIG. 2 shows a diagrammatic view of a switching circuit provided in accordance with an embodiment of the present invention.

With reference to FIG. 2 indicating as a whole and diagrammatically a circuit 1 provided in accordance with an embodiment of the present invention to allow effective switching between different supply voltages while avoiding latch-up phenomena.

The circuit 1 is designed in particular but not exclusively for an electrically programmable and erasable non-volatile memory device, e.g. a flash cell matrix with single power supply (not shown because conventional).

Figure 1:
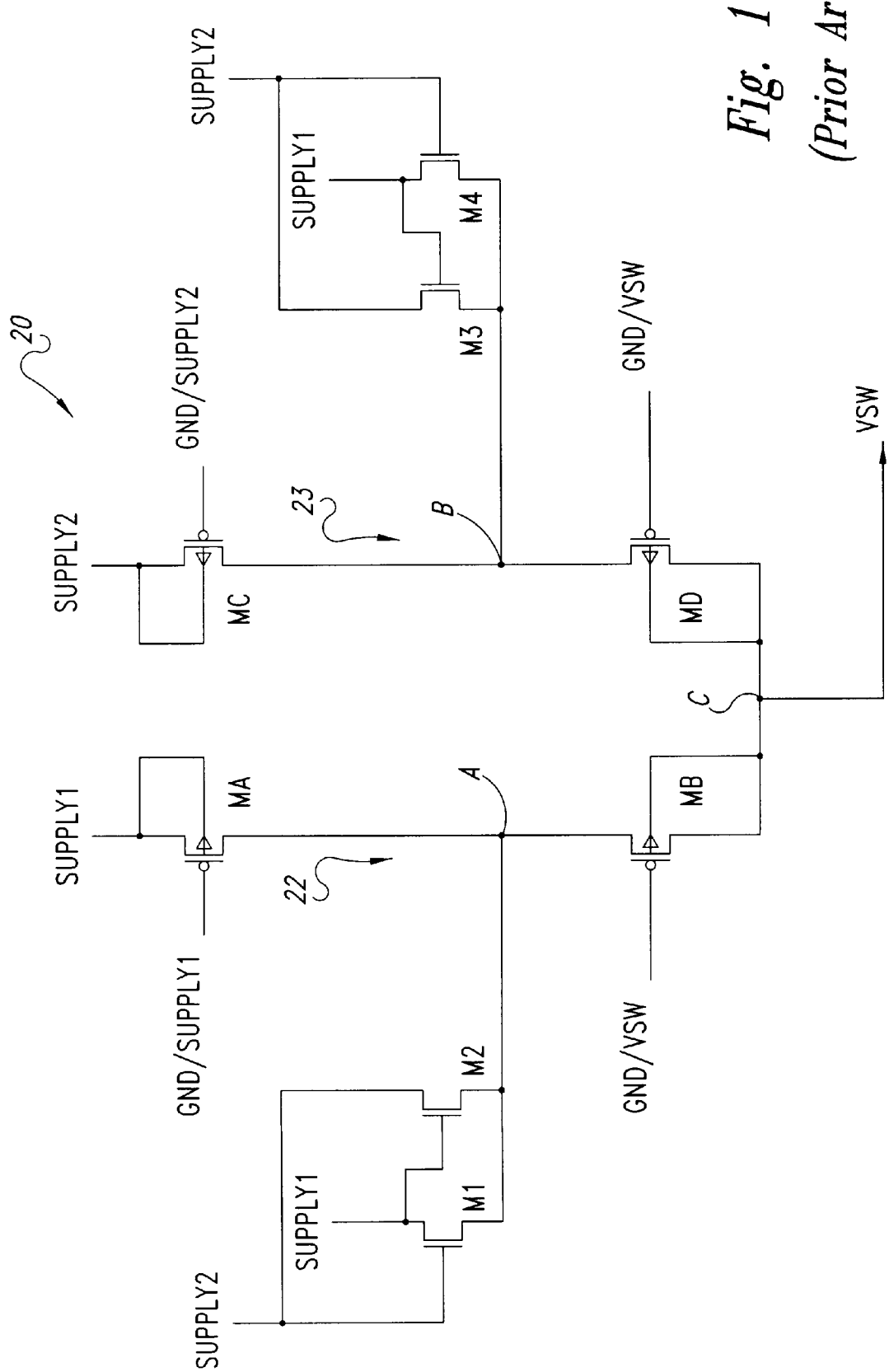
FIG. 1 shows a diagrammatic view of a switching circuit provided in accordance with the prior art.

To fully understand the structure of the circuit 1 in accordance with the embodiment of the present invention reference is again made to the example of FIG. 1 in which is shown a switching circuit 20 in accordance with the prior art.

The circuit 20 comprises a first 22 and a second 23 circuit branch each having a pair of P-channel MOS transistors arranged in mutual series.

For the first branch are indicated the transistors MA and MB while for the second branch are indicated the transistors MC and MD.

The well region of the first transistor MA of the first branch is connected to a first reference supply voltage SUPPLY1 while the well region of the first transistor MC of the second branch is connected to a second voltage reference SUPPLY2.

The well regions of the remaining two transistors MB and MD are connected to a common circuit node C on which is present the same voltage VSW.

In order that no junction be directly biased there are provided N-channel transistors M1, M2 for the first branch 22 and M3, M4 for the second branch 23. These transistors impose on the corresponding interconnection node A or B the lower voltage of the two possible supply voltages SUPPLY1 and SUPPLY2.

With reference to FIG. 2 the structure of the switching circuit 1 in accordance with the embodiment of the present invention is explained below in comparison with the embodiment in accordance with the prior art.

Even the circuit 1 in accordance with the embodiment of the present invention comprises two circuit branches 2 and 3. However, since the circuit structure is filly symmetrical, in FIG. 1 is shown for simplicity only one of these branches, i.e. that indicated by reference number 2.

Branch 2 of the circuit 1 comprises a transistor bridge and in particular consisting of P-channel MOS transistors.

A first pair 5 of transistors M1, M2 is connected in series between the first voltage reference SUPPLY1 and the circuit node D held at the voltage VSW. The interconnection point between the transistors M1 and M2 is indicated as circuit node E.

The node D must be understood as being connected to the node C common to the other circuit branch 3 (which is not shown) of the switching circuit 1.

Similarly to the first pair, a second pair 4 of transistors M3, M4 is series connected between the same voltage reference SUPPLY1 and the node D. The first transistors M1, M3 of the first pair 5 and the second pair 4 have their respective body terminals connected to the voltage reference SUPPLY1 while the second transistors M2, M4 of the first pair 5 and the second pair 4 have their body terminals connected to the common node D.

The transistors M1, M2 of the first pair 5 are bigger than the transistors of the second pair 4 by at least one order of magnitude.

Between the transistors M3 and M4 which make up the second pair 4 are inserted two resistors R1, R2. The interconnection point between the resistors R1 and R2 is indicated as circuit node F.

The interconnection nodes E and F are mutually short-circuited.

The gate terminals GATEM1, GATES of the first pair 5 of transistors M1, M2 are connected to respective drain terminals of corresponding P-channel transistors M5 and M6.

Specifically the transistor M5 is connected between the first reference power supply SUPPLY1 and the gate GATEM1 of the transistor M1 which is also connected to ground through a current generator Iref.

On the gate terminal of the transistor M5 is applied the voltage VSW through the source terminal of the transistor M6 which has its own drain terminal connected to the terminal GATES of the transistor M2 and its gate terminal connected to the first reference power supply SUPPLY1.

The terminal GATE2 of the transistor M2 is also connected to ground through a second current generator Iref2.

Each of the transistors M3 and M4 making up the second pair 4 has its respective gate terminals connected downstream of an inverter respectively indicated by 180 for the transistor M4 and 179 for the transistor M3. The first inverter 180 is powered by the voltage VSW while the second inverter 179 is powered by the voltage SUPPLY1.

The inputs of the inverters 179 and 180 are connected to the same output of a delay circuit DELAY receiving at input a signal CONNECT_VSW_SUPPLY1.

The output of the first inverter 180 is input connected to another inverter 182 which is in turn connected at output to the gate terminal of a P-channel transistor M8 having its drain terminal connected to the terminal GATEM2 of the transistor M2. Both the inverter 182 and the transistor M8 are powered by the voltage VSW.

The output of the second inverter 179 is input connected to another inverter 183 which is in turn connected at output to the gate terminal of a P-channel transistor M7 having its drain terminal connected to the terminal GATEM1 of the transistor M1. Both the inverter 183 and the transistor M7 are powered by the reference SUPPLY1.

Operation of the circuit 1 in accordance with the embodiment of the present invention is now disclosed with reference to an initial state in which the common node C (i.e., VSW) is charged with a voltage of approximately 10 V and the switching phase evolves to bring to this node a standard supply voltage Vcc.

It is also assumed that the voltage SUPPLY1 is higher than the voltage VSW and in this case the gate terminals of the transistors M3 and M4 making up the second pair are to be held at the voltage VSW.

A logical enablement signal starts the switching. With a slight delay due to the block DELAY there are started the transistors M3 and M4 which are designated 'resistive' due to their characteristics. The transistor M5 is also started and biases the gate terminals GATEM1 of the transistor M1.

Only when the transistor M1 is completely on, the gate terminals of the transistors M3 and M4 are grounded by the delay circuit DELAY.

Under these conditions only the transistor M1 of the first pair is in conduction since it is powered by the smaller potential. None of the junctions can be biased directly because the higher voltage is that present on the node D and this voltage is decharging slowly through a resistance which is not illustrated in the FIGS. and is understood to be connected to the node D.

Direct connection between the transistors M1 and M2 of the first pair takes place when the other two transistors M3 and M4 of the second pair are off. The interconnection node E is held permanently at the lower voltage which is in this case the standard supply voltage Vcc since the transistor M1 is in conduction with a small drain-source voltage drop Vds and easily carries the current traversing the resistor R2.

The resistor R2 decouples the node E from the higher potential. Basically, the interconnection node E between the two transistors M1 and M2 is always held at the lower of the two power supply potentials.

When the node D has discharged to a point such that the difference between the voltage remaining on this node D and the standard supply voltage Vcc is less than the threshold of a transistor, the second transistor M2 of the first pair also starts.

Of the two P-channel transistors M5 and M6 the one with the gate terminal having a lower potential is in conduction. Accordingly M5 is off and M6 is on to bias GATEM2 at a high value.

The circuit in accordance with the embodiment of the present invention solves the technical problem and achieves numerous advantages the first of which is certainly the fact that excellent protection against latch-up is created.

In addition, during the switching between the different power supplies there is produced a controlled discharge of the nodes with higher potential.

What is claimed is:

1. In an electrically programmable non-volatile memory device, a circuit having a ground voltage reference and a plurality of branch circuits for switching between a plurality of voltage supplies other than the ground voltage reference, each branch circuit being coupled between a respective one of the voltage supplies and a terminal coupled to an element in the memory device to receive one of the voltage supplies other than the ground voltage reference, at least one of the branch circuits comprising:

a bridge circuit coupled between one of the voltage supplies and the terminal coupled to the element in the memory device, the bridge circuit comprising a first pair of first and second transistors coupled in series between the voltage supply and the terminal and a second pair of third and fourth transistors coupled in series between the voltage supply and the terminal, wherein the third and fourth transistors comprise transistors of a P-channel type; and a pair of resistors coupled in series between the third and fourth transistors of the second pair of transistors.

2. The circuit in accordance with claim 1, further comprising a second interconnection node between said pair of resistors, said second interconnection node being connected to a corresponding first interconnection node between the first and second transistors of said first pair of transistors.

3. In an electrically programmable non-volatile memory device, a circuit having a ground voltage reference and a plurality of branch circuits for switching between a plurality of voltage supplies other than the ground voltage reference, each branch circuit being coupled between a respective one of the voltage supplies and a terminal coupled to an element in the memory device to receive one of the voltage supplies other than the ground voltage reference, at least one of the branch circuits comprising:

a bridge circuit coupled between one of the voltage supplies and the terminal coupled to the element in the memory device, the bridge circuit comprising a first pair of first and second transistors coupled in series between the voltage supply and the terminal and a second pair of third and fourth transistors coupled in series between the voltage supply and the terminal, wherein the third and fourth transistors comprise transistors of a P-channel type; and wherein the first transistor has a gate terminal connected to a drain terminal of a fifth transistor and the second transistor has a gate terminal connected to a drain terminal of a sixth transistor, wherein the fifth and sixth transistors comprise P-channel transistors, the fifth transistor being coupled between the voltage supply and the gate terminal of the first transistor and the sixth transistor being coupled between a gate terminal of the transistor and the gate terminal of the second transistor, the fifth and sixth transistors having a drain terminal coupled to the ground voltage reference through a respective current generator.

4. In an electrically programmable non-volatile memory device, a circuit having a ground voltage reference and a plurality of branch circuits for switching between a plurality of voltage supplies other than the ground voltage reference, each branch circuit being coupled between a respective one of the voltage supplies and a terminal coupled to an element in the memory device to receive one of the voltage supplies other than the ground voltage reference, at least one of the branch circuits comprising:

a bridge circuit coupled between one of the voltage supplies and the terminal coupled to the element in the memory device, the bridge circuit comprising a first pair of first and second transistors coupled in series between the voltage supply and the terminal and a second pair of third and fourth transistors coupled in series between the voltage supply and the terminal, wherein the first and second transistors comprise transistors of a P-channel type; and wherein the first transistor has a gate terminal coupled to a first output of an inverter circuit and the second transistor has a gate terminal coupled to a second output of the inverter circuit, wherein inputs of the inverter circuit are connected to an output of a delay circuit, said delay circuit being coupled at an input to receive a switching enablement signal.

5. In an electrically programmable non-volatile memory device, a circuit having a ground voltage reference and a plurality of branch circuits for switching between a plurality of voltage supplies other than the ground voltage reference, each branch circuit being coupled between a respective one of the voltage supplies and a terminal coupled to an element in the memory device to receive one of the voltage supplies other than the ground voltage reference, at least one of the branch circuits comprising:

a bridge circuit coupled between one of the voltage supplies and the terminal coupled to the element in the memory device, the bridge circuit comprising a first pair of first and second transistors coupled in series between the voltage supply and the terminal and a second pair of third and fourth transistors coupled in series between the voltage supply and the terminal;

a first node connected between the first and second transistors; and first and second resistors connected in series between the third and fourth transistors, the first and second resistors being connected together at a second node, the second node being connected to the first node.

6. In an electrically programmable non-volatile memory device, a circuit having a ground voltage reference and a plurality of branch circuits for switching between a plurality of voltage supplies other than the ground voltage reference, each branch circuit being coupled between a respective one of the voltage supplies and a terminal coupled to an element in the memory device to receive one of the voltage supplies other than the ground voltage reference, at least one of the branch circuits comprising:

a bridge circuit coupled between one of the voltage supplies and the terminal coupled to the element in the memory device, the bridge circuit comprising a first pair of first and second transistors coupled in series between the voltage supply and the terminal and a second pair of third and fourth transistors coupled in series between the voltage supply and the terminal; and wherein each of the first and second transistors is larger than either of the third transistor or the fourth transistor.

7. In an electrically programmable non-volatile memory device, a circuit having a ground voltage reference and a plurality of branch circuits for switching between a plurality of voltage supplies other than the ground voltage reference, each branch circuit being coupled between a respective one of the voltage supplies and a terminal coupled to an element in the memory device to receive one of the voltage supplies other than the ground voltage reference, at least one of the branch circuits comprising:

a bridge circuit coupled between one of the voltage supplies and the terminal coupled to the element in the memory device, the bridge circuit comprising a first pair of first and second transistors coupled in series between the voltage supply and the terminal and a second pair of third and fourth transistors coupled in series between the voltage supply and the terminal; and a comparing circuit having a first input coupled to the voltage supply, a second input coupled to the terminal, a first output coupled to a control terminal of the first transistor and a second output coupled to a control terminal of the second transistor, the comparing circuit being structured to render either the first transistor or the second transistor conductive to maintain a first node at a minimum voltage based on a comparison between the voltage supply and a voltage at the terminal.

8. In an electrically programmable non-volatile memory device, a circuit having a ground voltage reference and a plurality of branch circuits for switching between a plurality of voltage supplies other than the ground voltage reference, each branch circuit being coupled between a respective one of the voltage supplies and a terminal coupled to an element in the memory device to receive one of the voltage supplies other than the ground voltage reference, at least one of the branch circuits comprising:

a bridge circuit coupled between one of the voltage supplies and the terminal coupled to the element in the memory device, the bridge circuit comprising a first pair of first and second transistors coupled in series between the voltage supply and the terminal and a second pair of third and fourth transistors coupled in series between the voltage supply and the terminal; and a logic circuit having an input coupled to receive a control signal, a first output coupled to a control terminal of the third transistor and a second output coupled to a control terminal of the fourth transistor, the logic circuit being structured to control a conductive state of each of the third and fourth transistors based on the control signal.

9. In an electrically programmable non-volatile memory device, a circuit having a ground voltage reference and a plurality of branch circuits for switching between a plurality of voltage supplies other than the ground voltage reference, each branch circuit being coupled between a respective one of the voltage supplies and a terminal coupled to an element in the memory device to receive one of the voltage supplies other than the ground voltage reference, at least one of the branch circuits comprising:

a bridge circuit coupled between one of the voltage supplies and the terminal coupled to the element in the memory device, the bridge circuit comprising a first pair of first and second transistors coupled in series between the voltage supply and the terminal and a second pair of third and fourth transistors coupled in series between the voltage supply and the terminal; and wherein each of the first and third transistors has a body terminal coupled to the voltage supply and each of the second and fourth transistors has a body terminal coupled to the terminal.

10. The circuit of claim 9 wherein the third and fourth transistors comprise transistors of the P-channel type.

* * * * *